United States Patent
Huang et al.

(10) Patent No.: US 10,074,816 B2
(45) Date of Patent: Sep. 11, 2018

(54) SUBSTRATE STRUCTURE FOR ELECTRONIC DEVICE AND PRODUCTION METHOD THEREOF

(71) Applicant: Industrial Technology Research Institute, Chutung, Hsinchu County (TW)

(72) Inventors: Yueh-Chuan Huang, Chutung (TW); Chyi-Ming Leu, Chutung (TW)

(73) Assignee: Industrial Technology Research Institute, Chutung, Hsinchu County, Taiwan (CN)

( * ) Notice: Subject to any disclaimer, the term of this patent is extended or adjusted under 35 U.S.C. 154(b) by 30 days.

(21) Appl. No.: 14/578,705

(22) Filed: Dec. 22, 2014

(65) Prior Publication Data
US 2016/0181553 A1    Jun. 23, 2016

(51) Int. Cl.
*B32B 3/30* (2006.01)
*B32B 27/08* (2006.01)
(Continued)

(52) U.S. Cl.
CPC .......... *H01L 51/0097* (2013.01); *B32B 27/08* (2013.01); *B32B 3/30* (2013.01);
(Continued)

(58) Field of Classification Search
CPC ....... B32B 7/06; B32B 7/02; B32B 2307/748; B32B 2457/206; B32B 3/30;
(Continued)

(56) References Cited

U.S. PATENT DOCUMENTS 7,566,950 B2 *   7/2009   Huang ............. G02F 1/133305
                                                        257/52
7,989,314 B2     8/2011   Lee et al.
(Continued)

FOREIGN PATENT DOCUMENTS

CN      102194829 A     9/2011
CN      103325734 A     9/2013
(Continued)

OTHER PUBLICATIONS

Eom et al., "Close-packed hemispherical microlens arrays for light extraction enhancement in organic light-emitting devices," *Org. Electron.*, 12:472-467 (2011).
(Continued)

*Primary Examiner* — Joanna Pleszczynska
(74) *Attorney, Agent, or Firm* — McCarter & English, LLP; Yu Lu

(57) ABSTRACT

The present disclosure provides a substrate structure for an electronic element, which includes a supporting carrier; a release layer having a first microstructure on a surface thereof, and the release layer having first adhesion to the supporting carrier; and a flexible substrate for disposing the supporting carrier and the release layer thereon, wherein the flexible substrate has second adhesion to the release layer, the first adhesion is greater than the second adhesion, and the surface of the flexible substrate in contact with the surface of the release layer has a second microstructure opposing to the first microstructure. The present disclosure further provides a method for fabricating the substrate structure.

19 Claims, 2 Drawing Sheets

(51) Int. Cl.
*B32B 27/30* (2006.01)
*H01L 51/00* (2006.01)

(52) U.S. Cl.
CPC . *B32B 2457/206* (2013.01); *H01L 2251/5338* (2013.01); *Y02E 10/549* (2013.01)

(58) Field of Classification Search
CPC ... B32B 27/281; B32B 27/283; B32B 27/308; B32B 27/08; Y10T 428/24942; H05K 1/0393; H01L 51/0097; H01L 27/28; H01L 27/288; B29C 70/68
USPC .......................... 428/98, 172, 174, 212, 220
See application file for complete search history.

(56) References Cited

U.S. PATENT DOCUMENTS

| | | | |
|---|---|---|---|
| 8,173,249 B2 | 5/2012 | Leu et al. | |
| 8,179,034 B2* | 5/2012 | Potts | B82Y 20/00 |
| | | | 313/504 |
| 8,376,017 B2 | 2/2013 | Lee et al. | |
| 2005/0069713 A1 | 3/2005 | Gupta et al. | |
| 2008/0304287 A1 | 12/2008 | Chiang et al. | |
| 2010/0203296 A1 | 8/2010 | Tsai et al. | |
| 2011/0229992 A1 | 9/2011 | Potts et al. | |
| 2013/0161864 A1 | 6/2013 | Liang et al. | |

FOREIGN PATENT DOCUMENTS

| | | | |
|---|---|---|---|
| CN | 103765625 A | 4/2014 | |
| CN | 103872256 A | 6/2014 | |
| GB | 2482193 A | 1/2012 | |
| TW | I311030 B | 6/2009 | |
| TW | I311126 B | 6/2009 | |
| TW | 201011427 A | 3/2010 | |
| TW | 201106447 A | 2/2011 | |
| TW | 201322834 A | 6/2013 | |
| TW | 201425522 A | 7/2014 | |
| TW | 201426929 A | 7/2014 | |
| TW | 201432349 A | 8/2014 | |

OTHER PUBLICATIONS

Heni and Lowen, "Surface Freezing on Patterned Substrates," *Phys. Rev. Letts.*, 85(17):3668-3671 (2000).
Melpignano et al., "Efficient light extraction and beam shaping form flexible, optically integrated organic light-emitting diodes," *Appl. Phys. Letts.*, 88:153514-1-153514-3 (2006).
Melpignano et al., "Light extraction and customized optical distribution from plastic micro-optics integrated OLEDs," *Proc. of SPIE*, 6192:61920V-1-61920V-13 (2006).
Moller and Forrest, "Improved light out-coupling in organic light emitting diodes employing ordered microlens arrays," *J. Appl. Phys.*, 91(5):3324-3327 (2002).
TW 201322834 English abstract.
TW 201425522 English abstract.
TW I311030 English abstract.
TW I311126 English abstract.
CN 103325734 English Abstract.
CN 103765625 English Abstract.
CN 103872256 English Abstract.
Chinese Office Action for Application No. 201410815467.1, dated Mar. 27, 2018. 9 pages.
CN 102194829 English abstract.
TW 201011427 English abstract.
TW 201106447 English abstract.
TW 201426929 English abstract.
TW 201432349 English abstract.
Office Action dated Feb. 17, 2016 in TW 103144722.

\* cited by examiner

SUBSTRATE STRUCTURE FOR ELECTRONIC DEVICE AND PRODUCTION METHOD THEREOF

TECHNICAL FIELD

The present disclosure relates to substrate structures for electronic elements and fabrication methods thereof, and more specifically, to a substrate structure for protecting a microstructure and a fabrication method thereof.

BACKGROUND

Flexible electronics are mainly divided into flexible elements, flexible displays, flexible sensors and flexible energy sources. Because of their lightness, thinness and flexibility, the flexible electronics have become the trend of development of the next-generation electronic products. The applications of flexible electronics are mainly in the industries of displays, illumination and solar photoelectricity. Among these, illuminating light sources which use organic light-emitting diodes (OLED) have been regarded as the next-generation illuminating light sources. However, to use the OLED illuminations in the industries, the problem of failing to increase the efficiency needs to be urgently solved. Currently, the solution to the problem involves not only the improvement of the light-emitting materials, but also the results of light out-coupling. Calculations made based on the Snell's Law showed that the amount of usable luminance is actually only about 20%. It will be desirable to significantly improve the luminances of OLEDs by the improvements in the external light out-coupling of substrate modes and internal light out-coupling of wavelength and surface plasmon modes.

Accordingly, the lack of improvement in the efficiency of light out-coupling is currently an issue, which needs to be urgently solved.

SUMMARY

The present disclosure provides a method for fabricating a substrate structure for an electronic element, which includes: forming a release layer having opposing first and second surfaces on a supporting carrier, wherein the release layer has a first area, and is formed on the supporting carrier by being in contact with the supporting carrier via the second surface; forming a first microstructure on the first surface of the release layer, and curing the release layer to allow the release layer to have first adhesion to the supporting carrier; forming a flexible substrate on the supporting carrier and the release layer, and covering the supporting carrier and the release layer with a second area of the flexible substrate, wherein the second area is larger than the first area, and a surface of the flexible substrate in contact with the first surface of the release layer has a second microstructure opposing to the first microstructure; and curing the flexible substrate to allow the flexible substrate to have second adhesion to the release layer, wherein the first adhesion is greater than the second adhesion.

According to the above method, the present disclosure further provides a substrate structure for an electronic element, which includes a supporting carrier; a release layer having opposing first and second surfaces and a first area, and the release layer being disposed on the supporting carrier by being in contact with the supporting carrier via the second surface, wherein the first surface area has a first microstructure, and the release layer has first adhesion to the supporting carrier; and a flexible substrate disposed on the first surface of the release layer, having a second area larger than the first area, and arranged to cover the supporting carrier and the release layer, wherein the flexible substrate has second adhesion to the release layer, the first adhesion is greater than the second adhesion, and a surface of the flexible substrate in contact with the first surface of the release layer has a second microstructure opposing the first microstructure.

The substrate structure for an electronic element of the present disclosure has a pattern of a microstructure, without an additionally attached external light out-coupling film. A simple structure and a fabrication method can solve the problem of light out-coupling. Moreover, by the adhesion of the flexible substrate and the supporting carrier, the two would not come off during the subsequent fabrication of an element. Thereafter, in light of the property that the flexible substrate and the release layer can be easily separated, after the completion of the fabrication of an electronic element, the flexible substrate is diced along the border of the release layer having the first surface. As a result, the flexible substrate and the release layer are easily separated. The flexible substrate is supported by the supporting carrier, so as to make it easier for the flexible substrate to participate in the subsequent fabrication of an element.

BRIEF DESCRIPTIONS OF DRAWINGS

DETAILED DESCRIPTION OF THE DISCLOSED EMBODIMENTS

The following specific embodiments illustrate the detailed description of the present disclosure, such that one skilled in the art can readily conceive the other advantages and effects of the present disclosure from the disclosure of the present specification.

Figure 1:
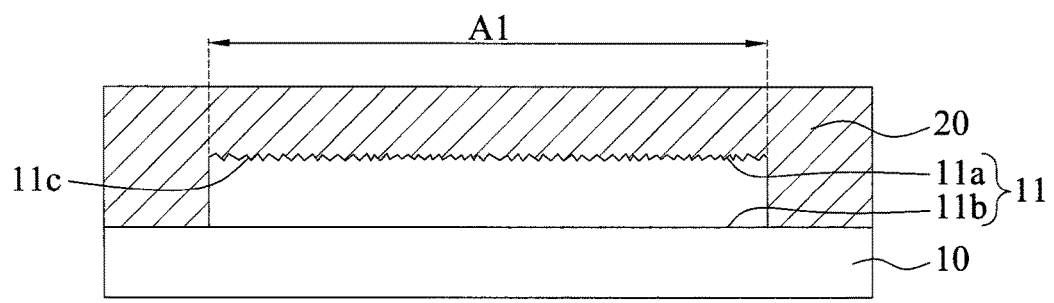
FIG. 1 is a schematic diagram of a microstructure formed by a release layer.

The present disclosure provides a method for fabricating a substrate structure for an electronic element. As shown in FIG. 1, a release layer 11 having opposing first surface 11a and second surface 11b are formed on a supporting carrier 10. The release layer 11 has a first area A1. The release layer 11 is formed on the supporting carrier 10 by being in contact with the supporting carrier 10 via the second surface 11b, wherein the supporting carrier 10 can be any material that is rigid enough for subjecting to any processes thereon, so as to be used for forming the release layer 11 and a flexible substrate 12. Generally, the appearance of the supporting carrier 10 can be layered or a plate. For example, the supporting carrier 10 can be a plate selected from at least one of the group consisting of glass, quartz, a silicon wafer and a metal sheet.

The release layer 11 can be formed of a thermosetting polymer. Usually, the thermosetting polymer can be dissolved in a solvent, applied on the supporting carrier 10 by, for example, coating, and then dried to obtain the release layer 11. Moreover, the material of the release layer 11 is not limited. In a non-limiting example, the release layer 11 is formed of at least a material selected from the group consisting of polysiloxane, polysiloxane hybridized materials, cyclic olefin copolymers (COC), poly(methyl methacrylate) (PMMA), and polyimide (PI).

The substrate structure for an electronic element of the present disclosure has a microstructure, which is formed on the surface of a flexible substrate. The microstructure is fabricated by the transfer of a release layer. The followings illustrate the fabrication method thereof.

As shown in FIG. 1, before curing the release layer 11, a mold 20 is used to imprint the first surface 11a of the release layer 11 to form a first microstructure 11c thereon. The term "curing" mentioned herein refers to complete curing or hardening of the release layer 11. That is, during the fabrication of the first microstructure 11c on the first surface 11a of the release layer 11, the mold 20 can be used to directly imprint the coated thermosetting polymer (which is dissolved in a solvent), and the mold 2 is removed after the release layer 11 is partially cured or hardened.

Figure 2:
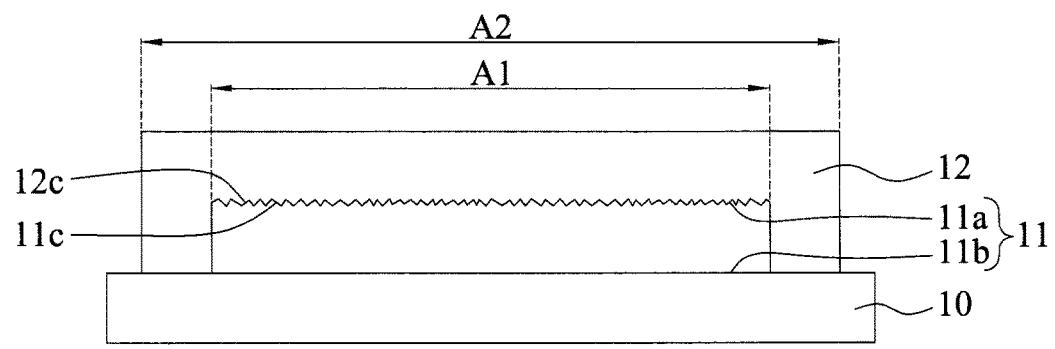
FIG. 2 is a schematic diagram of a substrate structure.

Then, the release layer 11 is cured. The term "curing" used herein refers to a heat treatment or UV radiation. In a non-limiting example, the heat treatment is conducted at 150° C. for 2 hours, or UV radiation at light illumination of 1000 mJ/cm$^2$ for 120 seconds. After curing, the release layer 11 has first adhesion to the supporting carrier 10. For example, the first adhesion ranges from 1B to 5B. In one example, as shown in FIG. 2, another thermosetting polymer is coated on the supporting carrier 10 and the release layer 11, so as to fabricate the flexible substrate 12. The same as mentioned in the aforesaid method for fabricating the release layer 11, the coating is not particularly limited. Examples of the coating include blade coating and roller coating. The material of the coated flexible substrate 12 is not particularly limited, and is mainly selected from thermosetting and transparent materials. The utilization of the properties of thermosetting and the release layer allows for easy separation, and the transparent material is suitable for an optical element. For example, the flexible substrate is made of at least a material selected from the group consisting of polyimide, polycarbonate (PC), polyethersulfone (PES), polynorbornene (PNB), polyester, polyetheretherketone (PEEK), and polyetherimide (PEI).

The supporting carrier 10 and the release layer 11 are covered by a second area A2 of the formed flexible substrate 12, and the second area A2 is larger than the first area A1. The surface of the flexible substrate 12 in contact with the first surface 11a of the release layer 11 has a second microstructure 12c opposing the first microstructure 11c. The second microstructure 12c includes a plurality of convex portions, which are hemispherical, conical, barrel-shaped or irregularly concavo-convex, and the size of each of the convex portions ranges from 1 nm to 1 mm After the completion of coating, the flexible substrate 12 is cured. The purpose of curing is to harden the flexible substrate 12. In a non-limiting example, the flexible substrate 12 is heated at 80° C. and 150° C. each for 1 hour, or heated at 220° C. for 3 hour, so as to cure the flexible substrate 12, and thereby allowing the flexible substrate 12 to have second adhesion to the release layer 11. For example, the second adhesion ranges from 0B to 1B, and the first adhesion is greater than the second adhesion.

According to the above method, a substrate structure for an electronic element can be provided, which includes the supporting carrier 10, the release layer 11, and the flexible substrate 12.

The supporting carrier 10 can be made of any material that is rigid enough to subject to other processes thereon, so as to dispose the release layer 11 and the flexible substrate 12 thereon. Generally, the appearance of the supporting carrier 10 can be layered or a plate. For example, the supporting carrier 10 can be a plate selected from at least one of the group consisting of glass, quartz, a silicon wafer and a metal sheet.

The release layer 11 has the first area 11a, and the release layer 11 has the opposing first surface 11a and second surface 11b. The release layer 11 is formed on the supporting carrier 10 by being in contact with the second surface lib, the first surface 11a has the first microstructure 11c, and the release layer 11 has the first adhesion to the supporting carrier 10. For example, the first adhesion ranges from 1B to 5B. Moreover, the release layer is formed of a thermosetting polymer. In one embodiment, the release layer is formed of at least a material selected from the group consisting of polysiloxane, polysiloxane hybridized materials, COC, PMMA, and PI.

The flexible substrate 12 is disposed on the supporting carrier 10 and the first surface of the release layer 11. The supporting carrier 10 and the release layer 11 are covered by the second area A2 of the flexible substrate 12 larger than the first area A1, and the flexible substrate 12 has the second adhesion to the release layer 11. For example, the second adhesion ranges from 0B to 1B. The first adhesion is greater than the second adhesion. The surface of the flexible substrate 12 in contact with the first area 11a of the release layer 11 has the second microstructure 12c opposing to the first microstructure 11c. The second microstructure 12c includes a plurality of convex portions, which are hemispherical, conical, barrel-shaped or irregularly concavo-convex, and the size of each of the convex portions ranges from 1 nm to 1 mm Moreover, the flexible substrate 12 is made of a thermosetting polymer. In one embodiment, the flexible substrate 12 is at least a material selected from polyimide, PC, PES, PNB, polyester, PEEK, and PEI.

Figure 3:
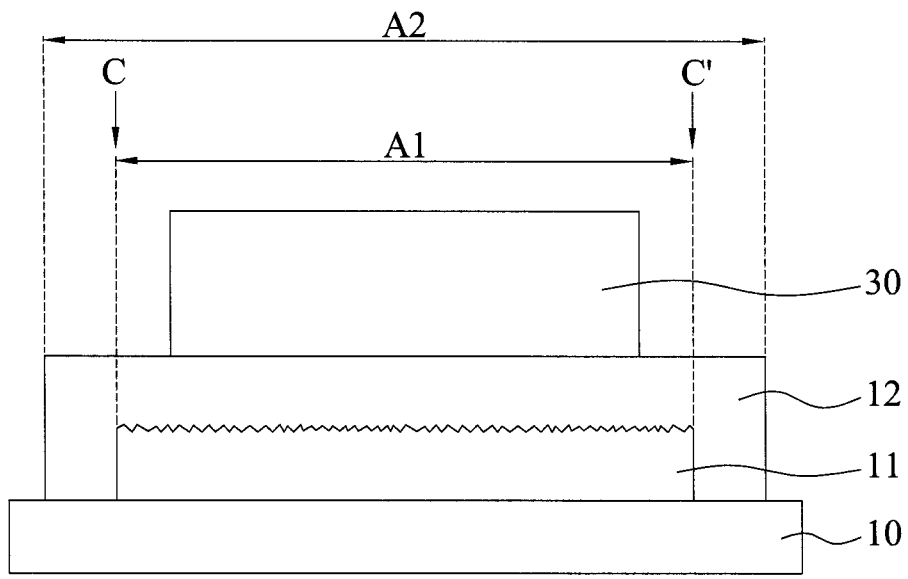
FIG. 3 is a schematic diagram of a substrate structure having an electronic element.

Furthermore, as shown in FIG. 3, the supporting carrier 10 is covered by both ends C and C' of the first surface A1 of the release layer 11, or the inner sides of the ends C and C' can be used as dicing points to dice the flexible substrate 12, so as to separate the flexible substrate 12 and the release layer 11. However, prior to the separation of the flexible substrate 12 and the release layer 11, the supporting carrier 10 and the release layer 11 are covered by the second surface A2 of the flexible substrate 12 larger than the first area A1. Thus, the substrate structure for an electronic element can provide excellent fixation, thereby enabling the fabrication of an electronic element 30 (such as an OLED) on the flexible substrate 12.

Figure 4:
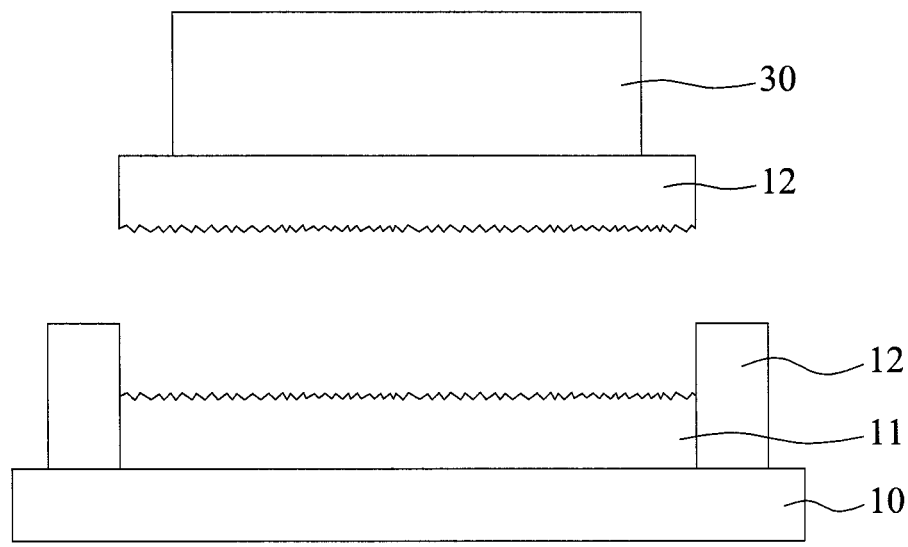
FIG. 4 is a schematic diagram of a flexible substrate having an electronic element, and a release layer.

As shown in FIG. 4, after further completing the subsequent fabrication of the electronic element 30 on the flexible substrate 12, the flexible substrate 12 is diced, so as to separate the flexible substrate 12 and the release layer 11.

EXAMPLES

Preparation of Release Layers

Preparation Example 1

Preparation of Release Layer 1

At room temperature, 0.5 g of polydimethylsiloxane (PDMS) main agent A and 0.05 g of PDMS curing agent B were poured into a beaker. After evenly stirring and defoaming, the prepared PDMS material was poured onto a 10 cm×10 cm glass carrier. A mold having a hemispherically concavo-convex structure was imprinted on the PDMS material, the excess material was removed, and heated at 150° C. for 2 hours. After cooling, the mold was removed, so as form release layer 1 with a microstructure pattern.

Preparation Example 2

Preparation of Release Layer 2

In a yellow light chamber, 0.5 g of polysiloxane hybridized materials (Ormostamp®, purchased from Micro Resist Technology GmbH) was poured onto a 10 cm×10 cm glass carrier. A mold having a hemispherically concavo-convex structure was imprinted on the polysiloxane hybridized material, the excess material was removed, and the polysiloxane hybridized material on the mold was illuminated with UV radiation at 1000 mJ/cm$^2$ for 120 seconds. The mold was removed after complete curing, so as to obtain the release layer 2 with a microstructure pattern. Preparation of polyimide solutions for flexible substrates Synthesis Example 1

Preparation of Polyimide (PI-1) Solution

Eighty-two point seven (82.7) grams of monomer A (2,2-bis[4-(4-aminophenoxy)phenyl]propane), 50 g of monomer B (bicyclo[2,2,2]oct-7-ene-2,3,5,6-tetracarboxylic dianhydride), and 530 g of m-cresol were added to 2 L of glass reaction tank. The mixture was electrically stirred and reacted at 220° C. for 4 hours, so as to form a polyimide solution with a solid content of 20%. The polyimide solution was re-precipitated with methanol. After baking to dry, filamentous polyimide was obtained. Dimethyl acetamide was added for dissolution, so as to formulate polyimide (PI-1) solution with a solid content of 15%. Polyimide (PI-1) had a b value (yellowness value) of 2.37, a weight average molecular weight of 25024 mol/g, and a viscosity of 13225 cp.

Synthesis Example 2

Preparation of Polyimide (PI-2) Solution

Twenty-eight point two (28.2) grams of monomer A, 32.1 g of monomer C (4,4-diaminodiphenyl ether), 50 g of monomer D (pyromellitic dianhydride), and 441.4 g of m-cresol were added to a glass reaction tank. The same preparation method as in synthesis example 1 was used to obtain filamentous polyimide. Dimethyl acetamide was added for dissolution, so as to formulate polyimide (PI-2) solution with a solid content of 15%. Polyimide copolymer (PI-2) had a b value of 1.95, a weight average molecular weight of 18572 mol/g, and a viscosity of 10955 cp.

Synthesis Example 3

Preparation of Silica/Polyimide Hybridized Material (PI-3) Solution

Fifty-one point five (51.2) grams of monomer E (4,4'-bis(3-aminophenoxy)diphenyl sulfone), 43.8 g of monomer F (4,4-bis(4-aminophenoxy)biphenyl), 50 g of monomer G (1,2,3,4-cyclopentanetetracarboxylic dianhydride), and 581.1 g of m-cresol were added to a glass reaction tank. The same preparation method as in synthesis example 1 was used to obtain filamentous polyimide. Dimethyl acetamide was added for dissolution, so as to formulate a polyimide solution with a solid content of 15%. Silica/polyimide was added at a weight ratio of 20:80 to 15% of a SiO$_2$ solution, so as to obtain silica/polyimide hybridized materials (PI-3) solution. Silica/polyimide hybridized materials (PI-1) had a b value of 2.12, a weight average molecular weight of 10938 mol/g, and a viscosity of 5840 cp.

Adhesion Testing

A cross-cut tester was applied vertically and orthogonally across a flexible substrate. The coating was divided into 100 grids, each with a size 1 mm×1 mm The regions cut by the cross-cut tester were stuck by 3M tape #600. The 3M tape was peeled off, and the adhesion where 100% of the grids were completely peeled off was 0B. The adhesion where 20% of the grids were not peeled off was 1B, and the adhesion where 100% of the grids were not peeled off was 5B.

Comparative Example 1

Preparation of Polyimide (PI-1) Substrate on a Stainless Steel Plate

PI-1 solution of synthesis example 1 was coated on a stainless steel plate, and cured to form PI-1 substrate. Then, adhesion testing was conducted on the stainless steel plate and PI-1 substrate. The results are shown in Table 1.

Comparative Example 2

Preparation of Silica/Polyimide Hybridized (PI-3) Substrate

PI-3 solution of synthesis example 3 was coated on a stainless steel plate, and cured to form PI-3 substrate. Then, an adhesion test was conducted on the stainless steel plate and PI-3 substrate. The results are shown in Table 1.

Example 1

Formation of PI-1 Substrate on Release Layer 1

PI-1 solution of synthesis example 1 was coated on release layer 1 of preparation example 1, and cured to form PI-1 substrate. Then, an adhesion test was conducted on release layer 1 and PI-1 substrate. The results are shown in Table 1.

Example 2

Formation of PI-1 Substrate on Release Layer 2

PI-1 solution of preparation example 1 was coated on release layer 2 of preparation example 2, and cured to form PI-1 substrate. Then, an adhesion test was conducted on release layer 2 and PI-1 substrate. The results are shown in Table 1.

Example 3

Formation of PI-3 Hybridized Substrate on Release Layer 1

PI-3 solution of preparation example 3 was coated on release layer 1 of preparation example 1, and cured to form PI-3 hybridized substrate. Then, an adhesion test was conducted on release layer 1 and PI-3 hybridized substrate. The results are shown in Table 1.

Example 4

Formation of PI-3 Hybridized Substrate on Release Layer 2

PI-3 solution of preparation example 3 was coated on release layer 2 of preparation example 2, and cured to form PI-3 hybridized substrate. Then, an adhesion test was conducted on release layer 2 and PI-3 hybridized substrate. The results are shown in Table 1.

TABLE 1

Results of Adhesion Testing

| | Substrate structure | Adhesion Test (Cross-Cut Tester) |
|---|---|---|
| Comparative example 1 | Stainless steel plate with PI-1 substrate | ≥1B |
| Comparative example 2 | Stainless steel plate with PI-3 hybridized substrate | 5B |
| Example 1 | Release layer 1 with PI-1 substrate | 0B |
| Example 2 | Release layer 2 with PI-1 substrate | 0B |
| Example 3 | Release layer 1 with PI-3 hybridized substrate | 0B |
| Example 4 | Release layer 2 with PI-3 hybridized substrate | 0B |

It is known from Table 1 that comparative examples 1 and 2 employed a conventional fabrication method for a flexible substrate. Without containing a release layer, the adhesion of the flexible substrate of comparative example 1 and the adhesion of the flexible substrate of comparative example 2 were both greater than 1B. As a result, after fabrication of the flexible substrates, it is difficult to separate each of the flexible substrates from the carrier. As compared with the results of testing on the substrates structures of examples 1-4, the flexible substrates were all peeled off easily from the substrate structures having release layers 1 and 2, without causing damages to the flexible substrates.
Testing for an Electrical Current Efficiency on Substrates Containing Electronic Elements Testing for an electrical current efficiency voltages and currents were conducted on the substrates each containing an electronic element of the following examples, by using a Keithley 238 equipment.

Comparative Example 3

Mere Use of a Glass as a Substrate

A TFT-grade glass substrate (with a thickness of 0 7 mm) was taken, and 200 nm of ITO, 500 nm of N,N'-bis(naphthalene-1-yl)-N,N'-bis(phenyl)benzidine (NPB), 10 nm of CBP:Irppy3 (3%), 10 nm of 2,9-dimethyl-4,7-diphenyl-1,10-phenanthroline (BCP), 35 nm of $Alq_3$, 0.5 nm of LiF, and 120 nm of aluminum were vapor deposited sequentially on the smooth surface of the glass substrate to form a green light OLED. Thereafter, testing for an electrical current efficiency current efficiency was conducted. Results are recorded in Table 2.

Comparative Example 4

Mere Use of PI-1 as a Substrate

PI-1 was coated on a smooth glass substrate, and cured to form PI-1 substrate (with a thickness of 300 μm). The glass substrate and PI-1 substrate were separated, and 200 nm of ITO, 50 nm of NPB, 10 nm of CBP:Irppy3 (3%), 10 nm of BCP, 35 nm of $Alq_3$, 0.5 nm of LiF, and 120 nm of aluminum were vapor deposited sequentially on the smooth surface of PI-1 substrate to form a green light OLED. Thereafter, testing for an electrical current efficiency current efficiency was conducted. Results are recorded in Table 2.

Comparative Example 5

Mere Use of PEN as a Substrate

A commercially available PEN substrate (TEONEX Q65FA PEN, with a thickness of 0.1 mm, and purchased from DuPont Teijin,) was taken, and 200 nm of ITO, 50 nm of NPB, 10 nm of CBP:Irppy3 (3%), 10 nm of BCP, 35 nm of $Alq_3$, 0.5 nm of LiF, and 120 nm of aluminum were vapor deposited sequentially on the smooth surface of the PEN substrate to form a green light OLED. Thereafter, testing for an electrical current efficiency current efficiency was conducted. Results are recorded in Table 2.

Comparative Example 6

Use of a PEN Substrate with an Externally Attached Light Out-coupling Film

A commercially available PEN substrate with an externally attached hemispherically concavo-convex light out-coupling film (Microlens Film, with a hemispherical height ranging from 20 to 30 μm, and purchased from EFUN Technology Corporation) was taken, and 200 nm of ITO, 50 nm of NPB, 10 nm of CBP:Irppy3 (3%), 10 nm of BCP, 35 nm of $Alq_3$, 0.5 nm of LiF, and 120 nm of aluminum were vapor deposited sequentially on the smooth surface of the PEN substrate to form a green light OLED. Thereafter, testing for an electrical current efficiency current efficiency was conducted. Results are recorded in Table 2.

Example 5

Formation of a PI-1 Substrate with an Irregularly Concavo-convex Structure on a Release Layer A release layer was prepared by the same method as in preparation example 1, except that an imprinting mold with a hemispherical concavo-convex structure was replaced with frost glass. Then, PI-1 solution was coated on the release layer, and cured to form a flexible substrate with an irregular concavo-convex lower surface and a smooth upper surface. The difference in the heights of the apex and the nadir of the irregularly concavo-convex structure was less than 3 μm. The thickness of the flexible substrate was 110 μm. Thereafter, 200 nm of ITO, 50 nm of NPB, 10 nm of CBP:Irppy3 (3%), 10 nm of BCP, 35 nm of $Alq_3$, 0.5 nm of LiF, and 120 nm of aluminum were vapor deposited sequentially on the smooth surface of PI-1 substrate to form a green light OLED. The release layer and the flexible OLED were separated. Finally, testing for an electrical current efficiency current efficiency was conducted. Results are recorded in Table 2.

Comparative Example 6

Formation of PI-1 Substrate on Release Layer 1

A release layer was prepared by the same method as in preparation example 1. PI-1 solution was coated on the release layer, and cured to form a flexible substrate with a hemispherically concavo-convex structure, which has a smooth upper surface and a lower surface with a concavo-convex structure (which is a hemispherically regular structure). The height of the hemisphere ranged from 20 μm to 30 μm, and the diameter of the hemisphere ranged from 50 μm to 60 μm. The thickness of the flexible substrate was 120 μm. Thereafter, 200 nm of ITO, 50 nm of NPB, 10 nm of CBP:Irppy3 (3%), 10 nm of BCP, 35 nm of $Alq_3$, 0.5 nm of LiF, and 120 nm of aluminum were vapor deposited sequentially on the smooth surface of PI-1 substrate to form a green light OLED. The release layer and the flexible OLED were separated. Therefore, testing for an electrical current efficiency current efficiency was conducted. Results are recorded in Table 2.

Example 7

Formation of PI-2 Substrate having an Irregularly Concavo-convex Structure on a Release Layer The same preparation method as in example 5 was conducted, except that PI-1 solution was replaced with PI-2 solution. The release layer and the flexible OLED were separated. Thereafter, testing for an electrical current efficiency current efficiency was conducted. Results are recorded in Table 2.

Example 8

Formation of PI-2 Substrate on Release Layer 1

The same preparation method as in example 6 was conducted, except that PI-1 solution was replaced with PI-2 solution. The release layer and the flexible OLED were separated. Thereafter, testing for an electrical current efficiency current efficiency was conducted. Results are recorded in Table 2.

Example 9

Formation of PI-3 Hybridized Substrate having an Irregularly Concavo-Convex Structure on a Release Layer The same preparation method as in example 5 was conducted, except that the release layer was replaced with release layer 2 of synthesis example 2, the imprinting mold having a hemispherically concavo-convex structure was replaced with frost glass, and PI-1 solution was replaced with a PI-3 solution. The release layer and the flexible OLED were separated. Thereafter, testing for an electrical current efficiency current efficiency was conducted. Results are recorded in Table 2.

Example 10

Formation of PI-3 Hybridized Substrate on Release Layer 2

The same preparation method as in example 6 was conducted, except that release layer 1 was replaced with release layer 2 of synthesis example 2, and PI-1 solution was replaced with PI-3 solution. The release layer and the flexible OLED were separated. Thereafter, testing for an electrical current efficiency current efficiency was conducted. Results are recorded in Table 2.

|  | Substrate | Shape of substrate microstructure | Electrical current efficiency (lm/W)(≥1000 nit) | Increase in efficiency |
|---|---|---|---|---|
| Comparative example 3 | Glass | None | 12.99 | — |
| Comparative example 4 | PI-1 substrate | None | 13.39 | 3.08% |
| Comparative example 5 | PEN substrate | None | 15.80 | 21.63% |
| Comparative example 6 | PEN substrate containing a light out-coupling film | Hemispherical | 21.81 | 67.90% |
| Example 5 | PI-1 substrate | Irregularly concavo-convex | 19.09 | 46.96% |
| Example 6 | PI-1 substrate | Hemispherical | 23.68 | 82.29% |
| Example 7 | PI-2 substrate | Irregularly concavo-convex | 18.49 | 42.34% |
| Example 8 | PI-2 substrate | Hemispherical | 23.16 | 78.29% |
| Example 9 | PI-3 hybridized substrate | Irregularly concavo-convex | 18.08 | 39.18% |
| Example 10 | PI-3 hybridized substrate | Hemispherical | 22.21 | 70.98% |

It is known from table 2 that, by using the electrical current efficiency of the glass substrate of comparative example 3 as a basis, the substrates of comparative examples 4 and 5 (which lacked microstructures) had obviously lower electrical current efficiency than those of examples 5-10 (which had microstructures). Moreover, among the substrates having the same hemispherical microstructures, the electrical current efficiency of substrate of comparative example 6 (which had multiple layers attached) was obviously lower than those of the substrates of examples 6, 8 and 10. This indicates that the present disclosure can achieve a high efficiency of light out-coupling by a simple structure and fabrication method, without the additionally attached external out-coupling films.

The above examples are provided only to illustrate the principle and effect of the present invention, and they do not limit the scope of the present invention. One skilled in the art should understand that, modifications and alterations can be made to the above examples, without departing from the spirit and scope of the present invention. Therefore, the scopes of the present disclosure should be accorded to the disclosure of the appended claims.

The invention claimed is:

1. A method for fabricating a substrate structure for an electronic element, comprising:
forming a release layer having opposing first and second surfaces on a supporting carrier, wherein the release layer has a first area, and is formed on the supporting carrier by being in contact with the supporting carrier via the second surface, and is at least one selected from the group consisting of polysiloxane, polysiloxane hybridized materials, poly(methyl methacrylate) (PMMA), and polyimide (PI);
forming a first microstructure on the first surface of the release layer, and curing the release layer, so that the release layer has a first adhesion to the supporting carrier;
forming a flexible substrate on the supporting carrier and the release layer, and covering the supporting carrier and the entire release layer with a second area of the flexible substrate, wherein the second area is larger than the first area, and a surface of the flexible substrate in contact with the first surface of the release layer has a second microstructure opposing the first microstructure; and
curing the flexible substrate, so that the flexible substrate has a second adhesion to the release layer, wherein the first adhesion is greater than the second adhesion.

2. The method of claim 1, wherein the supporting carrier is at least one selected from the group consisting of glass, quartz, a silicon wafer, and a metal sheet.

3. The method of claim 1, wherein the release layer is formed of a thermosetting polymer.

4. The method of claim 1, wherein prior to curing the release layer, the first surface of the release layer is imprinted by a mold to form the first microstructure.

5. The method of claim 1, wherein the second microstructure comprises a plurality of convex portions, each of the convex portions is one selected from the group consisting of hemispherical, conical, barrel-shaped, and irregularly concavo-convex.

6. The method of claim 5, wherein the size of each of the convex portions ranges from 1 nm to 1 mm.

7. The method of claim 1, wherein the curing is conducted by a heat treatment or UV radiation.

8. The method of claim 1, wherein the first adhesion ranges from 1B to 5B.

9. The method of claim 1, wherein the flexible substrate is made of a thermosetting polymer.

10. The method of claim 1, wherein the flexible substrate is at least one selected from the group consisting of polyimide, polycarbonate, polyethersulfone, polynorbornene, polyester, polyetheretherketone, and polyetherimide.

11. The method of claim 1, wherein the second adhesion ranges from 0B to 1B.

12. A substrate structure for an electronic element, comprising:
a supporting carrier;
a release layer having a first area and opposing first and second surfaces, and the release layer being disposed on the supporting carrier by being in contact with the supporting carrier via the second surface, wherein the first area has a first microstructure, and the release layer has a first adhesion to the supporting carrier and is at least one selected from the group consisting of polysiloxane, polysiloxane hybridized materials, poly(methyl methacrylate) (PMMA), and polyimide (PI); and
a flexible substrate disposed on the first surface of the release layer, having a second area larger than the first area, and arranged to cover the supporting carrier and the entire release layer, wherein the flexible substrate has a second adhesion to the release layer, the first adhesion is greater than the second adhesion, and a surface of the flexible substrate in contact with the first surface of the release layer has a second microstructure opposing the first microstructure, wherein the second microstructure comprises a plurality of convex portions each having a size ranging from 1 nm to 1 mm.

13. The substrate structure of claim 12, wherein the supporting carrier is formed of at least one selected from the group consisting of glass, quartz, a silicon wafer, and a metal sheet.

14. The substrate structure of claim 12, wherein the release layer is a thermosetting polymer.

15. The substrate structure of claim 12, wherein the first adhesion ranges from 1B to 5B.

16. The substrate structure of claim 12, wherein the flexible substrate is made of a thermosetting polymer.

17. The substrate structure of claim 12, wherein the flexible substrate is at least one selected from the group consisting of polyimide, polycarbonate, polyethersulfone, polynorbornene, polyester, polyetheretherketone, and polyetherimide.

18. The substrate structure of claim 12, wherein each of the convex portions is one selected from the group consisting of hemispherical, conical, barrel-shaped, and irregularly concavo-convex.

19. The substrate structure of claim 12, wherein the second adhesion ranges from 0B to 1B.

* * * * *

UNITED STATES PATENT AND TRADEMARK OFFICE
CERTIFICATE OF CORRECTION

PATENT NO. : 10,074,816 B2
APPLICATION NO. : 14/578705
DATED : September 11, 2018
INVENTOR(S) : Yueh-Chuan Huang et al.

Page 1 of 1

It is certified that error appears in the above-identified patent and that said Letters Patent is hereby corrected as shown below:

On the Title Page

In the left column, item (73), please replace the assignee field with the incorrect country code:
"(73) Assignee: Industrial Technology Research Institute, Chutung, Hsinchu County, Taiwan (CN)"
With:
--(73) Assignee: Industrial Technology Research Institute, Chutung, Hsinchu County, Taiwan (TW)--

Signed and Sealed this
Sixth Day of November, 2018

Andrei Iancu
*Director of the United States Patent and Trademark Office*